United States Patent [19]

Hardee

[11] Patent Number: 5,334,890
[45] Date of Patent: Aug. 2, 1994

[54] SENSE AMPLIFIER CLOCK DRIVER

[75] Inventor: Kim C. Hardee, Colorado Springs, Colo.

[73] Assignees: United Memories, Inc., Colorado Springs, Colo.; Nippon Steel Semiconductor Corp., Japan

[21] Appl. No.: 969,418

[22] Filed: Oct. 30, 1992

[51] Int. Cl.$^5$ .............................. H03K 5/01
[52] U.S. Cl. .................. 307/530; 307/263; 365/207
[58] Field of Search ............. 307/263, 270, 530; 365/207

[56] References Cited

U.S. PATENT DOCUMENTS

| | | | |
|---|---|---|---|
| 4,740,921 | 4/1988 | Lewandowski et al. | 365/207 |
| 5,111,064 | 5/1992 | Ward | 307/270 |
| 5,140,191 | 8/1992 | Nogle et al. | 307/270 |

Primary Examiner—Edward K. Look
Assistant Examiner—David W. Scheuermann
Attorney, Agent, or Firm—Edward D. Manzo

[57] ABSTRACT

A method and apparatus for generating two control signals (LPB and LNB) to activate local sense amplifier driver transistors is described. The rise and fall times of these signals as well as their levels keep the sense speed and peak currents as constant as possible over the specified voltage and temperature ranges. This is achieved preferably by using current sources based on resistors to control the rise/fall times and current mirrors or modeling circuits to set the voltage levels. Preferably circuitry is provided to determine when LNB and LPB reach intermediate and full voltage levels. The timing is set to spread out the current peak into three separate smaller peaks.

16 Claims, 6 Drawing Sheets

SENSE AMPLIFIER CLOCK DRIVER

FIELD OF THE INVENTION

The present invention relates to integrated circuits and particularly to the control of sense amplifiers in integrated circuit memories. The present invention provides control signals to drive sense amplifiers which are equipped with local driver transistors.

BACKGROUND OF THE INVENTION

As set forth in my companion application entitled, "SENSE AMPLIFIER WITH LOCAL WRITE DRIVERS" U.S. Ser. No. 07/976,312 filed Nov. 12, 1992 which is incorporated by this reference, integrated circuit memories have not, on belief, distributed local sense amplifier drivers so that each sense amplifier has respective connections to the power supply lines. Rather, the prior art has disclosed sense amplifiers with lumped drivers. Distributed local sense amplifier drivers provide advantages set forth in my reference companion application wherein, in one embodiment, CMOS technology is used for forming sense amplifiers in a high density integrated circuit memory. Each sense amplifier has a respective first local drive transistor for the p-channel transistor of the latch in the sense amplifier and a respective second local drive transistor for the n-channel transistors of the sense amplifier latch. Preferably, such drive transistors are field effect transistors (FETs) and are preferably p-channel and n-channel respectively. Preferably the source-drain path of such local drive transistors couples the latch transistors to a source of operating current (for the p-channel transistors) such as Vss and a second voltage source such as Vss or ground (for the n-channel transistors). Preferably the local drive transistors are coupled to be controlled by two control lines, one control line coupled to a plurality of first drive transistors and a second line coupled to a like plurality of second transistors. See FIG. 1. Further such control line pairs may control other sets of sense amplifiers elsewhere in the memory array.

Signals are needed to apply to such control lines to actuate from time to time the local sense amplifier drive transistors. Problems with prior art architectures are set forth in my referenced companion application, and include skewing and pattern sensitivity.

The primary object of this invention is to provide circuitry and a method by which the necessary control signals are provided for driving the sense amplifier local driver transistors.

A further object of the present invention is to provide such a driver which is able to control and limit the sensing speed and peak currents in the sense amplifiers driven thereby.

SUMMARY OF THE INVENTION

Two control signals are generated to activate local sense amplifier driver transistors. The control signals are referred to as LNB and LPB which may be understood to refer to Latch N BAR and Latch P BAR. ("BAR" generally connotes a complementary signal.) The rise and fall times of these signals as well as their levels keep the sense speed and peak currents as constant as possible over the specified voltage and temperature ranges. This is achieved preferably by using current sources based on resistors to control the rise/fall times and current mirrors or modeling circuits to set the voltage levels.

Preferably timing circuitry is provided to determine when LNB and LPB reach intermediate and full voltage levels. The timing is set to spread out the current peak into three separate smaller peaks.

Preferably the LPB signal is at one power supply voltage at precharge. At a first time T1 it begins to move toward its full active value at a controlled rate. It reaches an intermediate value at a second time T2, which is maintained until a third time T3. Then, LPB preferably moves at the same controlled rate to the full active value which it reaches at a fourth time T4. Then at a fifth time T5, it begins to change to its precharge state, reaching it at a sixth time T6.

Preferably the second control signal LNB is complementary to LPB and moves in a similar fashion but in opposite directions. Hence, in the preferred embodiment, it begins at the full inactive state or voltage, begins to move toward the active state at T1 at a controlled rate, stops moving at T2 when it reaches its intermediate value, remains there until T3 when it begins to move toward the full active state, reaching it at T4. Thereafter, at T5 it begins to move to the inactive state, reaching it at T6.

Structurally, the preferred configuration of the invented driver circuit employs a timer circuit, two sense amplifier current monitors responsively coupled to the timer, and two constant current sources controlled by corresponding ones of the monitor circuits. Preferably the circuitry senses when the intermediate value is reached, starts the timer, and after the timer reaches a certain condition, drives the LPB and LNB signals to their full active states.

BRIEF DESCRIPTION OF THE DRAWINGS

In describing preferred embodiments of the present invention, reference is made to accompanying drawings wherein.

DESCRIPTION OF PREFERRED EMBODIMENTS

Figure 1:
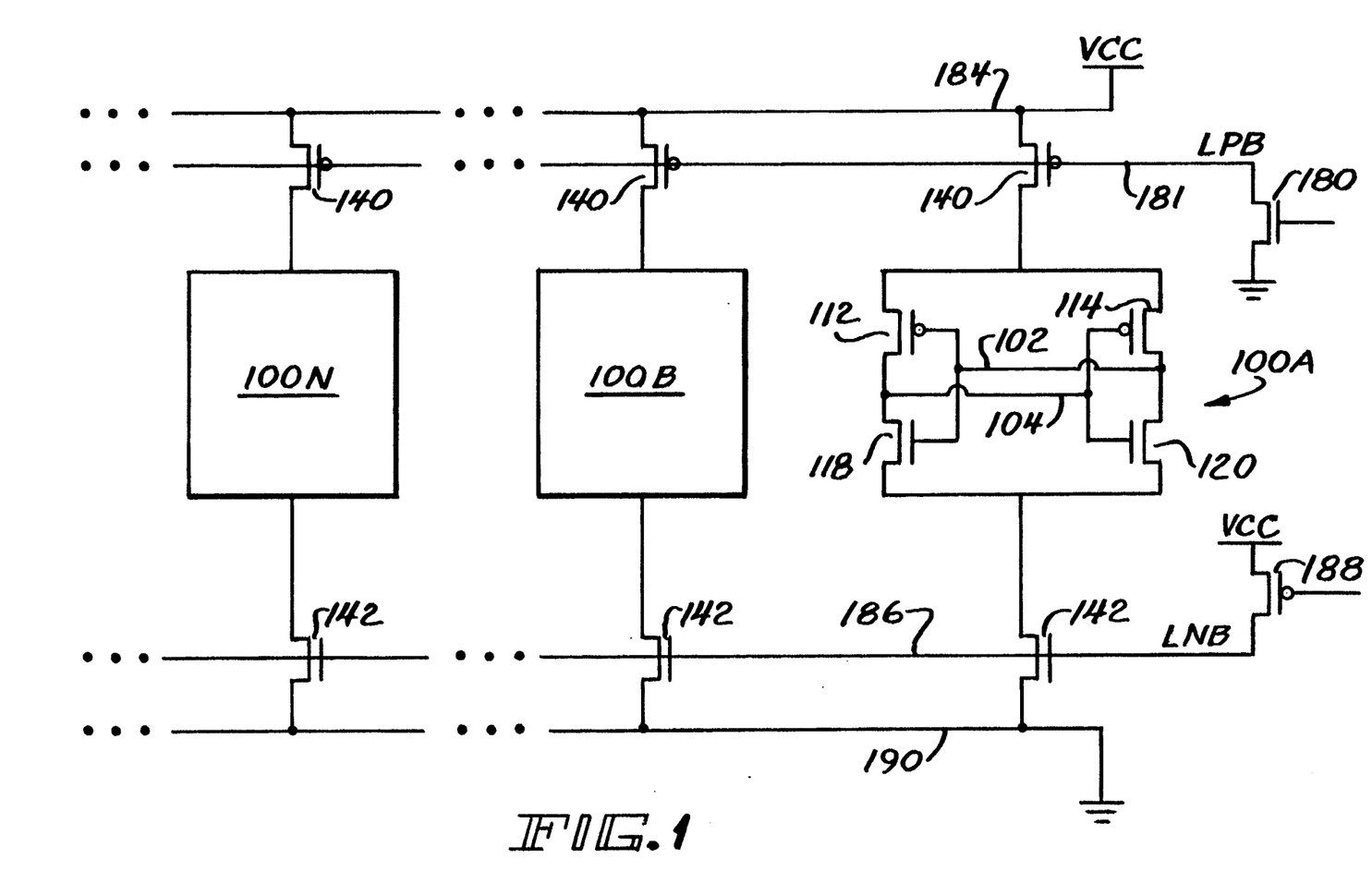
FIG. 1 shows an inventive arrangement of sense amplifiers with distributed driver transistors, each sense amplifier having a respective pair of driver transistors.

FIG. 1 shows one group of sense amplifiers 100A, 100B, . . . 100N from an integrated circuit memory. Further such groups are contemplated but not shown. Further details are given in my above-referenced application entitled "SENSE AMPLIFIER WITH LOCAL WRITE DRIVERS." Generally speaking, however, and using the same reference numerals in this FIG. 1 as assigned in the above-referenced application, it will be seen that each CMOS sense amplifier 100 includes a pair of p-channel transistors 112, 114 and a pair of n-channel transistors 118, 120. The gate electrodes of FETs 114 and 120 are coupled together and electrically form a node 104, while the gate electrodes of FETs 112 and 118 are coupled together to form a further node 102. It is to be understood that nodes 102 and 104 are sometimes referred to as the "internal nodes" of the latch or flip-flop, and that further circuitry is to be included by which those internal nodes are coupled, usually selectively, to one bit line or preferably a corresponding pair of bit lines. For example, for each sense amplifier there may be a left pair of bit lines and a right pair bit lines. Preferably, selection circuitry will determine which of those pairs, left or right, will be entitled to use the corresponding sense amplifier. It will be understood further that there are a plurality of columns, each having a respective sense amplifier, except to the extent that each of the sense amplifiers can be shared between two corresponding columns. For ease of illustration, only sense amplifier 100A has been shown with its internal latch circuitry, and it will be understood that beside it is a further sense amplifier 100B, which is one of N sense amplifiers. Further, it is to be understood that in a very large memory such as a 16 Meg DRAM, there will be a large number of subarrays or blocks of such sense amplifiers and corresponding columns. The bit lines have not been illustrated in FIG. 1 and would generally be perpendicular to the lines denoted by 102 and 104. While the preferred sense amplifier circuitry is illustrated, other circuitry could be substituted for a sense amplifier within the scope of some aspects of this invention. Here, each illustrated sense amplifier comprises a flip-flop.

Traditionally, power has been supplied to the sense amplifier 100 by connecting the source electrodes of transistors 112, 114 to a source of operating voltage such as Vcc, which may also be called a first power supply voltage. Further, the source electrodes of transistors 118 and 120 are coupled normally to a second voltage source, usually Vss or ground. Sometimes the upper FETs 112 and 114 of the drawing are coupled to receive a LATCH P signal selectively transitioning between Vcc and Vss. An aspect of the aforementioned above-referenced application is the provision of local sense amplifier drive transistors 140, 142. Preferably (but not necessarily) drive transistor 140 is a p-channel device while drive transistor 142 is an n-channel device. The source-drain path of transistor 140 is coupled between a power supply line 184 and the flip-flop, and the source-drain path of n-channel transistor 142 is coupled between the flip-flop and a further voltage line 190 which is connected to Vss. A further aspect of these inventions is that control signals LPB and LNB are coupled respectively to the gate electrodes of transistors 140 and 142.

The skilled artisan will recognize that each of lines 181, 184, 186 and 190 carry parasitic resistance. Those resistances have not been marked in these drawings, but are shown in the above-referenced application.

The present invention is concerned with providing the control signals LPB and LNB for lines 181, 186 respectively. It will be seen that when LNB is active (high), it turns on n-channel transistors 142, just as when LPB is active (low) it turns on p-channel transistors 140. If the configuration of transistors 140 and 142 is p-channel and n-channel, respectively, the LPB and LNB signals are configured so that when active, there is coupling from the Vcc power supply line 184 to the flip-flop, and there is coupling from the Vss line 190 to the flip-flop. Different combinations of p-channel and n-channel transistors are possible for all of transistors 140, 142, 180, and 188.

It may be recognized that the designation LPB stands for "latch P BAR" and LNB stands for "latch N BAR".

THE BLOCK DIAGRAM

Figure 2:
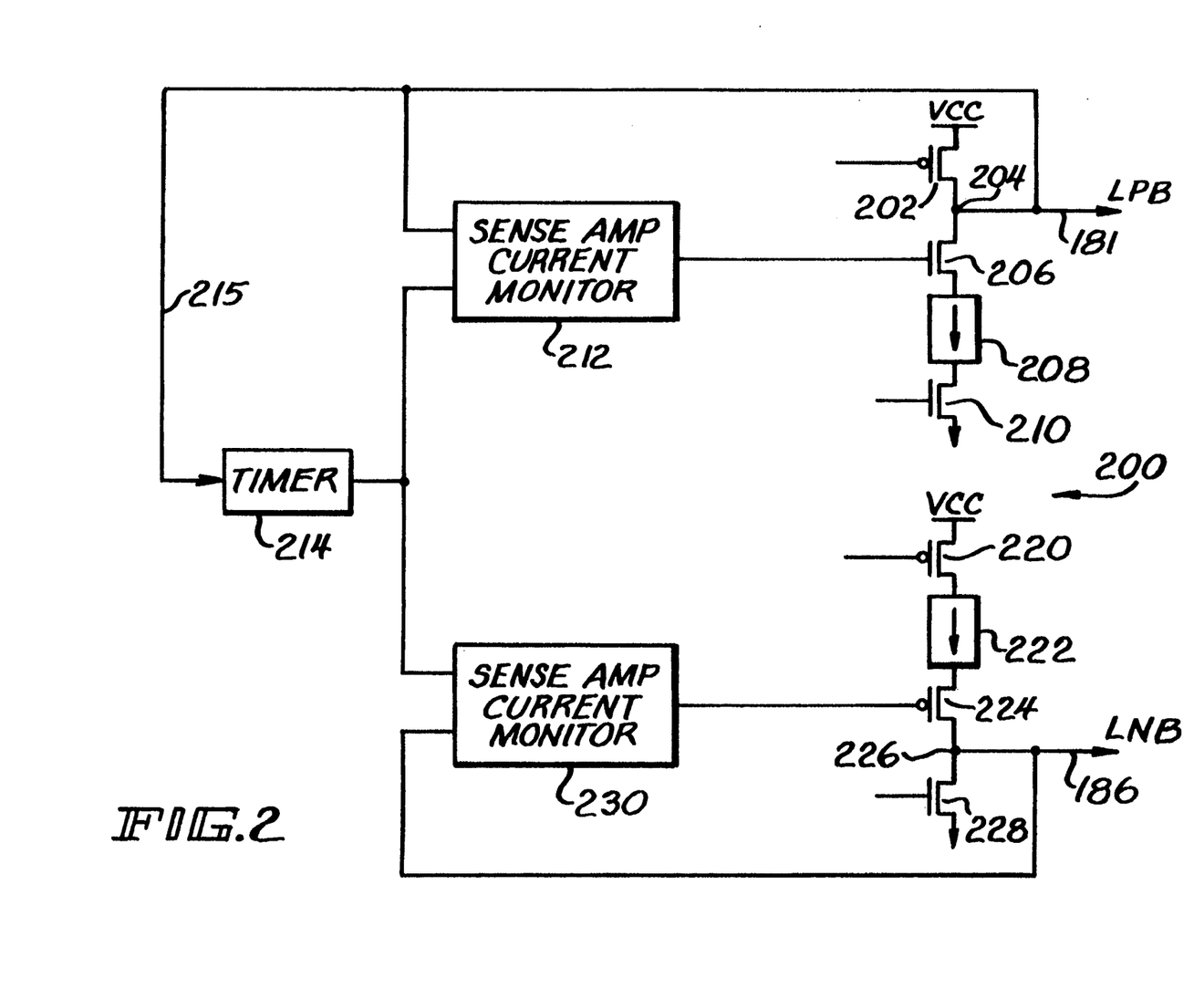
FIG. 2 shows in block diagram form a circuit according to aspects of the present invention, to provide the control signals LPB and LNB applied to the FIG. 1 arrangement.

FIG. 2 illustrates in simplified block form a circuit 200 according to various aspects of the present invention. As shown in FIG. 2, the signal LPB is generated on a line 181 and the signal LNB is generated on line 186, just as shown in FIG. 1. However, transistors 180 and 188 are not shown or used in the FIG. 2 drawing.

Associated with the LPB signal is a p-channel transistor 202 coupled between Vcc and a node 204, an n-channel transistor 206 coupled between node 204 and a constant current source 208, and a further n-channel transistor 210 coupled between the constant current source and ground. The n-channel transistor 206 is responsively coupled to a sense amplifier current monitor or modeling circuit 212. The LPB signal is fed back as an input to circuit 212. Also, signal LPB provides an input to a timer circuit 214, the output of which is applied as a further input to circuit 212.

Similarly, the signal LNB is associated with a p-channel transistor 220 coupled between Vcc and a second constant current source 222. A further p-channel transistor 224 is coupled between constant current source 222 and a node 226. Node 226 is coupled to line 186, and a further n-channel transistor 228 is coupled to have its source-drain path between node 226 and ground. A second sense amplifier current monitor or modeling circuit 230 has an input coupled to node 226 thereby to receive the LNB signal. Additionally, circuit 230 receives the output signal from timer 214. The output signal from circuit 230 is coupled to the gate electrode of transistor 224.

Integrated circuit memories frequently have a precharge period or epoch during which bit lines are adjusted or set in voltage. The precharge period is followed by and alternates with an active or sensing epoch. The signal applied to the gate electrode of FET 202 is low during the precharge and high during the sensing epoch. Since transistor 202 is a p-channel device, during precharge it is conductive to couple Vcc to line 181. Hence, LPB in the inactive state is high. During the sensing epoch, FET 202 turns off, thereby permitting the voltage at node 204 to be controlled in accordance with the operation of transistors 206 and 210, as well as the constant current source 208 between them. Conversely, FET 220 is off during precharge, and FET 228 is on, pulling node 226 and line 186 to ground. Thus LNB is low in the precharge epoch.

The output of monitor or modeling circuit 212 is high when LPB is to be driven to its low level (active), but goes low when a current limit is reached. It will be seen that when the output of circuit 212 is high, transistor 206 becomes conductive. Similarly, the voltage applied to the gate electrode of transistor 210 is such that transistor 210 is on during sensing but off during precharge.

Node 204 is coupled to timer 214 by a line 215. The timer output is low to drive LPB and LNB to their full active levels after a timed delay from LPB going to its intermediate level, described infra.

Figure 3A:
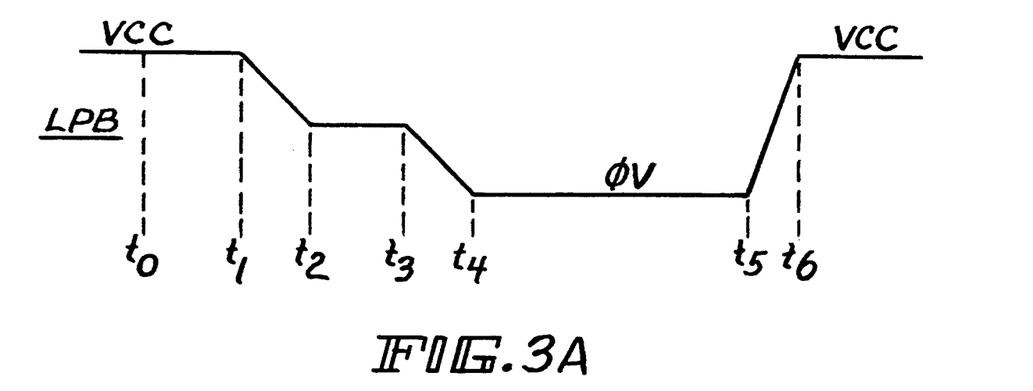
FIGS. 3A and 3B respectively show the preferred voltage transitions in the drive signals LPB and LNB.
Figure 3B:
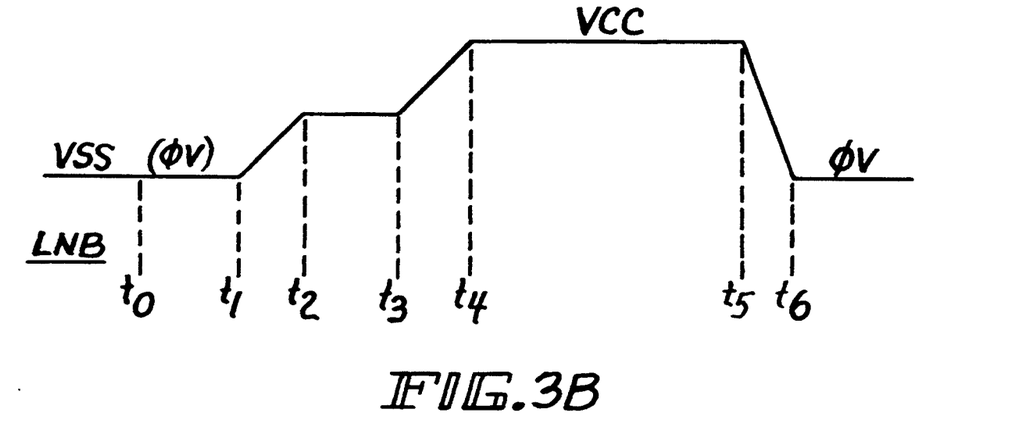

FIGS. 3A and 3B respectively show the signals LPB and LNB at times T0 through T6. At time T0, LPB is at its full Vcc level, high being its inactive state. At a time T1, according to various aspects of the present invention, LPB begins to pull toward Vss at a controlled rate. At time T2, the LPB signal reaches an intermediate level, and LPB is controlled to remain at that level until time T3. At time T3, LPB continues to move at a controlled rate toward its full active state of (preferably) zero volts, which it reaches at time T4. At time T5, the active signal begins to return to inactive which it reaches at time T6.

FIG. 3B shows the behavior of the signal LNB according to various aspects of the present invention. It will be seen that LNB is complementary to LPB and experiences the same relative transitions at the same times, and has similar or approximately the same controlled rates of change, and has a corresponding intermediate level.

With reference to FIGS. 3A and 3B, the rate of voltage change on LPB and LNB from time T1 through time T2 is controlled for the purpose of providing a slow initial sensing and to minimize the array VCC and VSS current spikes. The intermediate level of each of these signals (from time T2 through time T3) is controlled to regulate the current spike. The rate of change between times T3 and T4 is controlled to regulate the current spike also. The intermediate level and the controlled rates of change are set using on-chip resistors and are made fairly insensitive to VCC and temperature variations.

THE DETAILED CIRCUIT DIAGRAM

Figure 4:
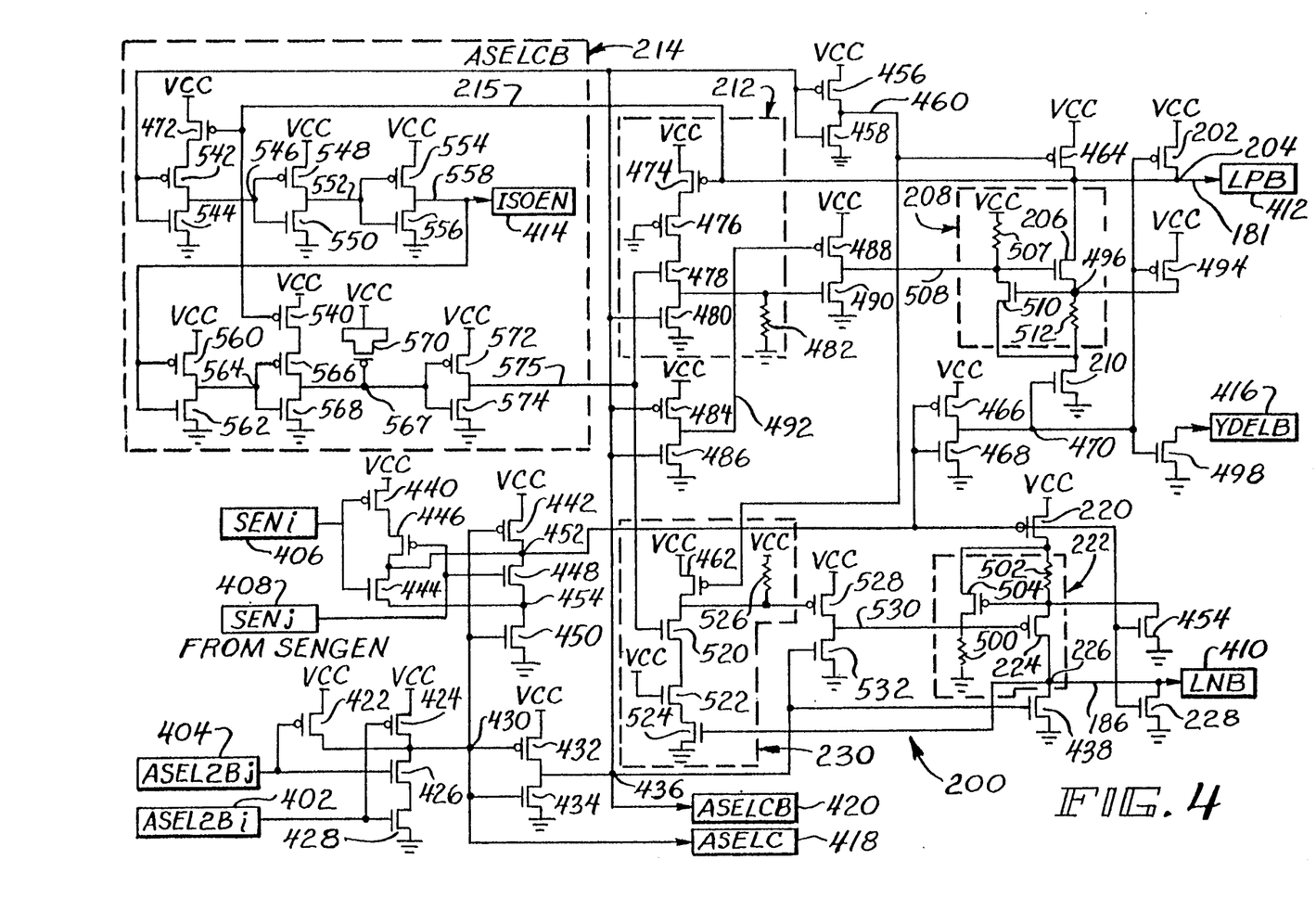
FIG. 4 is a schematic circuit diagram of one circuit as shown in FIG. 2.

FIG. 4 is a detailed schematic diagram of circuit 200. The devices and subcircuits within FIG. 4 which correspond to those of FIG. 2 are labeled with the same reference numerals. Generally, it will be seen that timer 214 is a collection of n-channel and p-channel transistors at the top left of FIG. 4. The current modeling circuits 212 and 230 are generally in the center of FIG. 4. The constant current sources 208 and 222 are are at the right side.

As shown in FIG. 4, circuit 200 receives various inputs such as Array Select signals at inputs 402 and 404 and SENSE signals on inputs 406 and 408. Outputs of the circuit are the LNB signal at output 410, the LPB signal at output 412, an isolation enable signal ISOEN at output 414, a column select delay bar signal YDELB at output 416, and further signals at outputs 418 and 420 which are array select signals used for other timing circuits not material here.

CONDITIONS DURING THE PRECHARGE EPOCH

During the precharge epoch (at time T0), the input signals have the following states:

| input signal | reference numeral | value @ precharge |
| --- | --- | --- |
| Sense (i) | 406 | low |
| Sense (j) | 408 | low |
| Array Select (i) | 402 | high |
| Array Select (j) | 404 | high |

Input circuitry at the bottom left portion of FIG. 4 includes transistors 422 through 434. With both Array Select inputs 402 and 404 high, transistors 422 and 424 both turn off, being p-channel transistors with sources coupled to VCC. Conversely, n-channel FETs 426 and 428 are on in this precharge condition, so a node 430 between FETs 426 and 426 is driven to ground. This node 430 is coupled to provide an output signal ASELC at an output 418, mentioned supra.

An inverter is formed by FETs 432 and 434 to provide an inverted output signal ASELCB at a node 436 coupled to output 420. With node 430 low during precharge, n-channel pull-down FET 434 turns off, and p-channel pull-up FET 432 turns on, thus pulling node 436 to VCC during precharge. Node 436 is coupled to the gate electrode of an n-channel FET 438 associated with the constant current source 222. By turning on FET 438 during precharge, LNB is pulled to VSS, as shown in FIG. 3B at time T0.

Node 430 is coupled to an input circuit having transistors 440 through 450. In particular, node 430 is coupled to the gate electrode of p-channel FET 442 and n-channel FET 450. Thus, during precharge, when the voltage at node 430 is pulled low, transistor 442 turns on and 450 turns off. Since the SENSE input at 406 is low during precharge, p-channel transistor 440 is on but an n-channel FET 444 is off. Since the other SENSE input at 408 is also low, a p-channel FET 446 is on, but an n-channel FET 448 is off. Hence VCC is coupled via the source-drain path of FET 440 and then FET 446 to a node 452 which is prevented from being pulled low by FET 448 and FET 450 being off.

Because node 452 is high during precharge, FET 220 is off, an n-channel FET 454 (far right side of FIG. 4) is on, and FET 228 is on. Since FET 228 is on, it pulls node 186 to ground; hence signal LNB is low during precharge.

Node 436 (ASELCB) is coupled to the gate electrodes of an inverter formed by FETs 456 and 458 shown at the center of FIG. 4. Since node 436 is high, FET 456 is off and FET 458 is on. A node 460 between them is therefore pulled low. Node 460 is coupled to gate electrodes of FETs 462 and 464, both p-channel devices which are therefore on.

Node 452 is coupled to an inverter formed by FETs 466 and 468. Having found node 452 high during precharge, since it is coupled to the gate electrodes of both p-channel FET 466 and n-channel FET 468, the former is off and the latter is on. This pulls to ground a node 470 between them. Node 470 located is coupled to the gate electrode of FET 210 and since that is an n-channel FET, it is off, as explained in connection with the FIG. 2 block diagram.

Node 470 is also coupled to the gate electrode of p-channel FET 202, which turns on. Its source-drain path therefore couples VCC to line 181 and output 412, wherefore signal LPB is held high during precharge. Since LPB is high and coupled via line 215 to the gate electrode of FET 472 in the timer 214, that FET is off. Operating current VCC does not flow into timer 214 from FET 472 at this time.

Sense amplifier modeling circuit 212 is similar to modeling circuit 230. Circuit 212 is associated with FET 474 (p-channel) and includes FETs 476 (p-channel), 478 (n-channel), 480 (n-channel), and a resistor 482. Coupled to circuit 212 are an inverter formed of FETs 484 (p-channel) and 486 (n-channel), as well as further FETs 488 (p-channel) and 490 (n-channel).

During precharge, node 181 is pulled high by FET 202, as already mentioned. Because this is coupled to the gate electrode of FET 474, it is off. The gate electrode of FET 476 is tied to ground and could be on depending on the source voltage of that FET. Node 436 (ASELCB) (high at precharge) is coupled to the gate electrode of FET 480 so it is on and the modeling circuit 212 is inactive at this time since no current is flowing through transistors 474, 476, 478 and resistor 482. Because node 436 is high, FET 484 is off and FET 486 is on, so a node 492 between them is pulled low by the source-drain path of FET 486. This turns on p-channel FET 488. Therefore the voltage at the gate electrode of FET 206 (node 508) is high. However, its source voltage also is high.

A p-channel FET 494 is shown (at the top right of FIG. 4) having its gate coupled to node 470. During precharge, node 470 is low, so FET 494 turns on to couple Vcc to a node 496, which is connected to the source electrode of FET 206. A further n-channel FET 498 also has its gate electrode coupled to node 470 and is off during precharge.

Thus, to summarize the precharge conditions as they have been described:

| Precharge Conditions | |
|---|---|
| node 181/215 (LPB) | high |
| node 186/226 (LNB) | low |
| node 436 | high |
| node 430 | high |
| node 452 | high |
| node 460 | low |
| node 470 | low |
| node 496 | high |
| node 508 | high |

THE SENSING OPERATION

Sensing occurs in response to either SENSE input 406 or 408 going high and either Array Select input 402 or 404 going low. Sensing signals applied to inputs 406 and 408 are generated by a timing circuit which determines when to start the sensing operation. These signals rise separately. Inputs ASEL2B at 402 and 404 are decoded signals. Preferably only one will go low to select an active array; only one will go low to start the timing sequence, in which circuit 200 is activated.

Much of the circuitry of FIG. 4 responds to node 452 dropping from its precharge condition of high to its sensing condition of low. This occurs at time T1 when either of the SENSE inputs 406 or 408 goes high and either of the array select signals at 402 or 404 drops low. For example, if SENSE input 406 goes high, it turns off FET 440 and turns on FET 444. When FET 444 turns on, it couples node 452 to a node 454 at the drain of FET 450. Alternatively, if SENSE input 408 goes high instead of SENSE input 406, it turns off FET 446 to stop Vcc from reaching node 452 via the source-drain path of FET 440. Also, the rise of input 408 turns on FET 448, the source-drain path of which couples node 452 to node 454. Hence, if either of the SENSE inputs changes from low to high, node 452 becomes coupled to node 454 via a low resistance path. It will be understood that node 452 is thus selectively coupled to node 454.

In FIG. 4, to allow node 452 to be pulled low, it will be seen that the path to Vcc via FET 442 must be opened and pull-down FET 450 must be turned on. This occurs when either of the array select signals at inputs 402 or 404 drops low. For example, if input 402 drops low, it turns on FET 424 and turns off FET 428, thereby allowing node 430 to rise. When this occurs, since node 430 is coupled to the gate electrode of FET 450, that transistor turns on, so that the source-drain path thereof pulls node 452 toward ground. Another result of node 430 going high is that FET 442 turns off, breaking that path from node 452 to Vcc.

In the other case, when node 404 rather than node 402 drops low, the low voltage renders FET 426 non-conducting (off), thus blocking the path to ground from node 430. Concomitantly, the low voltage at input 404 turns on FET 422, thereby coupling Vcc therethrough to node 430. Hence, as described above, when node 430 goes high, it causes FET 450 to turn on, pulling down node 454, and thereby pulling down node 452. Node 452 is coupled to the circuitry that regulates the important output signals LNB and LPB.

It will be seen that when node 430 goes high (at time T1), this is inverted at the inverter formed by FETs 432, 434, so that node 436 (the output of the inverter) goes low. Node 436 is coupled to one input of the timer circuit 214, the other signal input thereto being the LPB signal itself, applied via line 215.

In summary, then, at time T1, nodes 452 and 436 drop from high to low by virtue of the circuitry just described, which could be referred to as input circuitry or decoding circuitry. It will be understood that in other applications, other input or decoding circuitry could be employed, or it could be eliminated wholly or partially. Nodes 436 and 452 could (hypothetically) be coupled together in a modification or maintained separate, so that its (their) transition in voltage from one state to the other occurs at time T1 to commence the sensing operation.

As noted supra, the gate electrode of FET 228 has a low voltage during sensing, and the preceding discussion of the operation of node 452, which is coupled to the gate electrode of FET 228 (as well as 220 and 454) confirms this. At time T1 when node 452 drops to low voltage, FET 228 turns off and FET 220 turns on (being a p-channel device). It may be noted that because node 436 also drops low at time T1, pull-down FET 438 turns off also, so that LNB output node 226 is no longer pulled down to Vss. (LNB is selectively coupled to ground only FETs 228 and 438.) Now, with FET 220 turned on, constant current source 222 receives power therethrough. Consequently, the voltage at node 226 is supplied with current from Vcc through the source-drain path of transistor 220. Since this is a constant current, the voltage on line 186 (LNB) climbs at a constant rate, as shown by the straight-line ascension of LNB on FIG. 3B beginning at time T1.

Constant current source 222 includes a pair of resistors 500 and 502 as well as a pair of p-channel transistors 504 and 224. As voltage drops across resistor 502, transistor 504 turns on and pulls up the voltage at the gate electrode of FET 224. This makes FET 224 less conductive, which limits the current through FET 224 and limits the rise time of signal LNB. The rise time is determined by the value of resistor 502 and the threshold voltage of FET 504. Preferably, the resistors are formed with gate polysilicon which has a tightly controlled sheet resistance. Since the signal LNB is connected to the gate electrodes of the pull-down transistors in many sense amplifiers, the rise time of signal LNB takes part in determining the speed of operation of those sense amplifiers.

The upper right part of FIG. 4 also responds to nodes 452 and 436 dropping low at time T1. The low signal on node 452 is inverted by FETs 466 and 468, so that node 470 goes high in response to node 452 going low. This turns on pull-down transistor 210. Additionally, the high voltage on node 470 turns off FETs 202 and 494 so that neither of them may pull up output node 181 (LPB) to Vcc. Also, with node 436 having dropped low at time T1, the output node 460 of the inverter formed by FETs 456 and 458 goes high. This causes FET 464 to turn off, preventing it from pulling up LPB output node 204 (line 181) to Vcc.

Additionally, with VCC applied directly to a resistor 507 within constant current source 208, a node 508 is pulled high. Since node 508 is coupled to the gate electrode of FET 206, that FET conducts. With FET 210 now turned on, LPB discharges through the source-drain path of FET 206, resistor 512, and the source-drain path of FET 210 to pull down node 181 at a constant rate beginning at time T1.

At time T2, preferably the constant current sources 208 and 222 both turn off, leaving their corresponding output signals LPB and LNB at intermediate levels. This is caused by circuits 212 and 230 as discussed infra. In a modification of this sequence, the LPB and LNB signals may reach their intermediate levels at respective, non-coincident times.

One factor which determines the speed of sensing is the intermediate levels of LNB and LPB shown in FIG. 3. That intermediate level (time T2 through T3) is derived from a mirror circuit which approximately models the current flowing through the sense amplifiers. In FIG. 2, it is referred to as sense amp current monitor/model circuit. Preferably, there is one such modeling circuit 212 for LPB and a separate model circuit 230 for LNB.

Referring to circuit 230 and FIG. 4, n-channel transistors 520, 522, and 524 all have their source-drain paths coupled in series and are sized to model eight (illustratively) sense amplifiers. (It will be understood that other numbers of sense amplifiers can be chosen, and the choice depends on the current that will be drawn). A resistor 526 in the model circuit 230 is connected between VCC and the drain electrode of transistor 520. Node 226 is coupled to the gate electrode of FET 524. As LNB is rising, the current through FET 524 correspondingly increases; it is the same as the current through resistor 526. Hence the voltage drop across resistor 526 increases while LNB rises from time T1 to T2.

When the voltage drop across resistor 526 reaches $V_{TP}$ (the threshold voltage for a p-channel transistor), then a p-channel transistor 528 turns on (since the voltage at its gate electrode will now have dropped at least one $V_{TP}$ below Vcc to which the source electrode of FET 528 is coupled directly to).

When transistor 528 turns on after an initial amount of current has been drawn, transistor 528 pulls up a node 530 toward Vcc, assuming that an n-channel pull down transistor 532 is essentially off. Node 530 is coupled to the gate electrode of p-channel FET 224. With node 530 rising to Vcc, that voltage causes FET 224 to turn off. Since it is the source-drain path of FET 224 which couples voltage from Vcc to node 226 where the signal LNB is taken, the rise in voltage of signal LNB terminates at time T2. This is the intermediate level illustrated in FIG. 3B between times T2 and T3. Thus it will be understood that circuit 230 both models current and (with transistor 528) operates as a sensing circuit.

The level of LNB determines how much current flows through the pull-down transistors 142 in the sense amplifiers of FIG. 1 and elsewhere in the chip. Therefore, it can be seen that the value of resistor 526 determines the amount of current flowing through the sense amplifier.

Similarly, the intermediate voltage level for LPB which occurs between times T2 and T3 is controlled by model circuit 212. Referring to FIG. 4, p-channel transistors 474 and 476 and n-channel transistor 478 all have their source-drain paths coupled in series and are sized to model eight (illustratively) sense amplifiers. A resistor 482 in model circuit 212 is connected between Vss and the source electrode of transistor 478. Node 204 is coupled to the gate electrode of FET 474. As LPB drops, the current through FET 474 correspondingly increases; it is the same current through resistor 482. Hence, the voltage drop across resistor 482 increases while LPB drops from T1 to T2.

When the voltage drop across resistor 482 reaches $V_{TN}$ (the threshold voltage for an n-channel transistor), then n-channel transistor 490 turns on, pulling node 508 toward Vss. Node 508 is coupled to the gate electrode of n-channel FET 206. With node 508 falling to Vss, that voltage causes FET 206 to turn off. Since it is the source-drain path of FET 224 which couples voltage from Vss to node 204 (LPB), the voltage decline of signal LPB terminates at time T2. This is the intermediate level illustrated in FIG. 3A between times T2 and T3. The level of LPB determines how much current flows through the pull-up transistors 140 in the sense amplifiers of FIG. 1.

It will be recalled from the preceding discussion as well as FIGS. 3A and 3B that LPB and LNB generally move in complementary fashions, so that at time T1, the signal LPB starts declining from Vcc toward zero volts. The LPB signal is coupled on line 215 into timer 214, which is shown in both FIG. 2 and FIG. 4. Timer 214 includes transistors 472 and 542 through 574. Since LPB, which is at Vcc during precharge but which begins to decline at time T1, is coupled to the gate electrodes of transistors 472 and 540, both of which are p-channel FETs having sources coupled to Vcc, both of these devices will turn on once LPB has dropped by one $V_{TP}$. The gate electrodes of FETs 542 and 544 are coupled to receive a signal ASELCB from node 436.

The timer circuit 214 controls time T3 when LPB starts traversing from the intermediate level to ground potential and LNB goes from the intermediate level to Vcc. Already described supra is a sequence where LPB is starting to go low which turns on transistor 472. Transistors 542 and 544 have their gate electrodes coupled to receive the signal ASELCB (from node 436), which at this time is low. Therefore, since LPB is at some intermediate value, node 546 starts rising. The speed with which node 546 rises is determined by the level of LPB, which in turn determines the amount of current flowing through transistor 472.

Node 546 is the input to an inverter which is made up of transistors 548 and 550. Therefore the output of that inverter goes low. That low voltage goes to an inverter made up of transistors 554 and 556. Its output at a node 558 (ISOEN—an isolation enable signal) goes high. ISOEN is a signal that goes to a circuit not shown here called ISOGEN, which provides the appropriate isolation signal, ISO left or ISO right, above Vcc at that time.

ISOEN at node 558 (high) also is the input to an inverter in circuit 214 made up of transistors 560 and 562. So the output of that inverter (at a node 564) goes low. Node 564 is connected to the gate electrodes of another inverter formed of transistors 566 (p-channel) and 568 (n-channel); therefore FET 568 is turned off and transistor 566 is turned on at that time. FET 566 is connected in series via p-channel transistor 540 to Vcc potential. The gate electrode of FET 540 is connected to receive LPB (at node 215) which again has the intermediate level at this time. Therefore FET 540 is also on, and its conductance is determined by the level of LPB since transistors 540 and 566 are both p-channel transistors. A node 567 is pulled high, toward $V_{CC}$ potential. The speed by which it is pulled high is determined by the level of LPB and by the capacitance value of transistor 570. That determines the timing of the circuit. Node 567 (going high) is the input at the gate electrodes of transistors 572 and 574 which form another inverter having an output node 575.

Node 575 therefore goes low and is applied to the current modeling or mirror circuit 212 that includes transistors 476, 478, 474 and resistor 482. Because node 575 that is now going low is coupled to the gate of n-channel transistor 478, it turns off the current in the current modeling circuit. This current was going through transistors 474, 476, 478 and through resistor 482 to ground, causing a voltage drop across resistor 482 which set the intermediate level on LPB. With FET 478 now off, the voltage drop across resistor 482 goes to zero, and therefore the gate voltage applied to n-channel transistor 490 goes to zero volts. At that time, node 508 is pulled to $V_{CC}$ through resistor 507.

This rise at node 508 occurs at time T3 and marks the end of the intermediate level. This rise again activates the current source 208 which pulls LPB toward ground potential at the controlled rate which is controlled by the current flowing through current source 208. At time T4, LPB reaches ground potential (full active state) and stays there until precharge time (T5).

A similar response to the timer 214 occurs on the portion of the circuit that generates LNB. Node 575 (at the output of timer 214) goes low after the timer circuit 214 times out, as discussed supra. Node 575 is coupled to modeling circuit 230 and specifically to the gate input of n-channel transistor 520. This turns off the current flowing through transistors 520, 522 and 524 toward ground potential. That is also the current that was flowing through resistor 526. Therefore, the voltage drop across resistor 526 goes to zero. Hence, the gate of transistor 528 is pulled to $V_{CC}$ potential, and since it is a p-channel transistor, it turns off. This causes (or allows) node 530 at its drain to go toward ground potential.

This turns on the current source 222 which pulls LNB from the intermediate level toward $V_{CC}$ potential at a controlled rate determined by the amount of current flowing through the current source. Signal LNB reaches $V_{CC}$ potential at time T4 and stays there until precharge.

In controlling the current spikes in an array of sense amplifiers used in a preferred embodiment, the timing of the signals ISOL and ISOR relative to LPB and LPN is important. These signals are shown in the accompanying FIGS. 5 and 6. It will be understood that each sense amplifier 100 (FIG. 1) is coupled to left and right bit lines and is usable either with the pair of left bit lines or the pair of right bit lines, under the control of pass transistors which are gated by the ISOL and ISOR signals. At the beginning of an active cycle, before time t1, signal ISO for the non-selected array drops from $V_{CC}$ to $V_{SS}$. Initially the ISO signal for the selected array stays at $V_{CC}$. A short time after the LNB and LPB signals have reached their intermediate levels (at time T2), the isolation signal ISO for the selected array is driven (before time T3) above $V_{CC}$ to fully restore the bit lines to the $V_{CC}$ level. Then at time T4 the LPB and LNB signals are driven to their full active states ($V_{SS}$ and $V_{CC}$ respectively). This sequence broadens the sense amplifier current spike and reduces the current peak.

Figure 5:
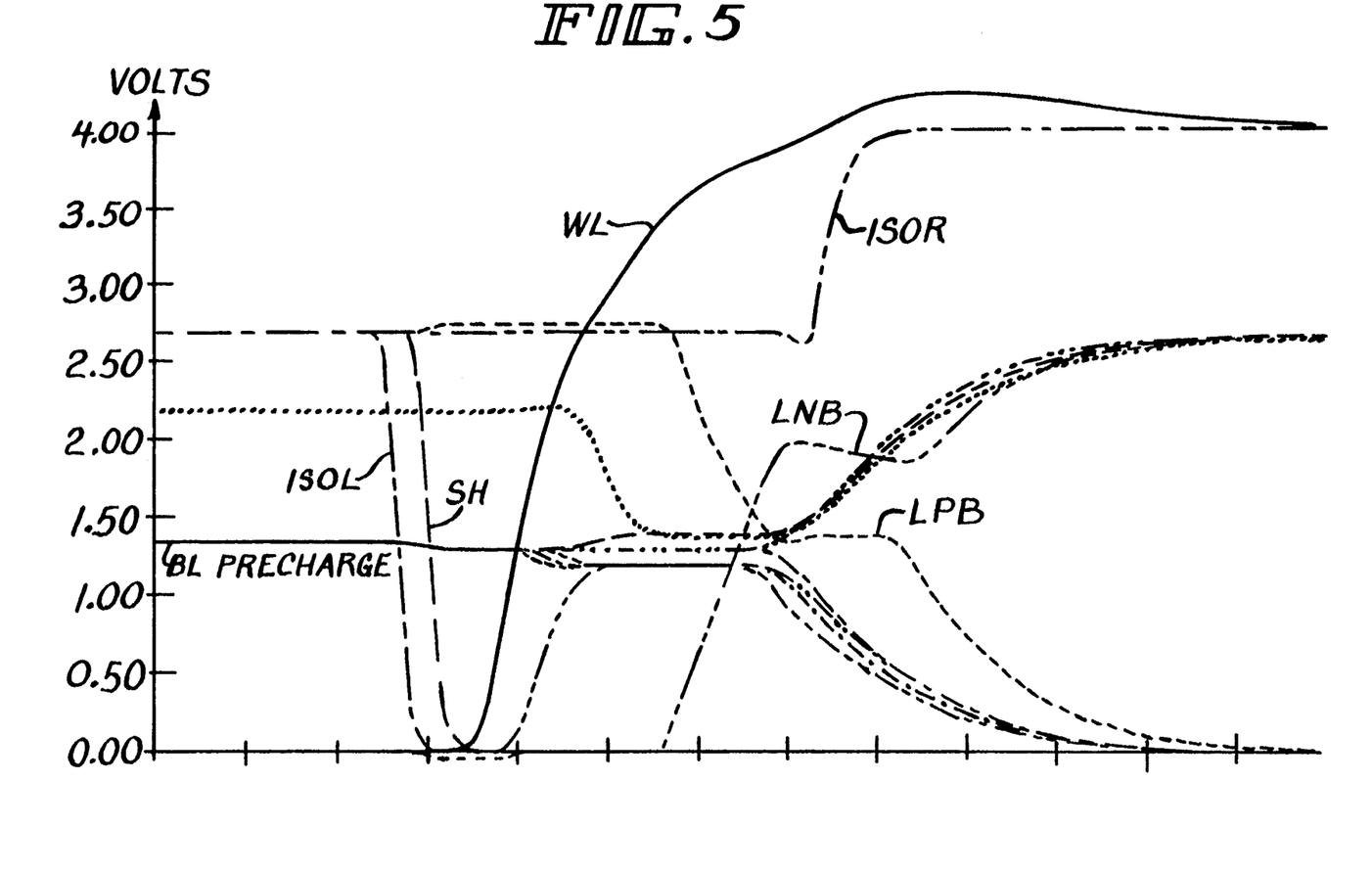
FIGS. 5 and 6 are waveforms resulting for an embodiment of the invention.
Figure 6:
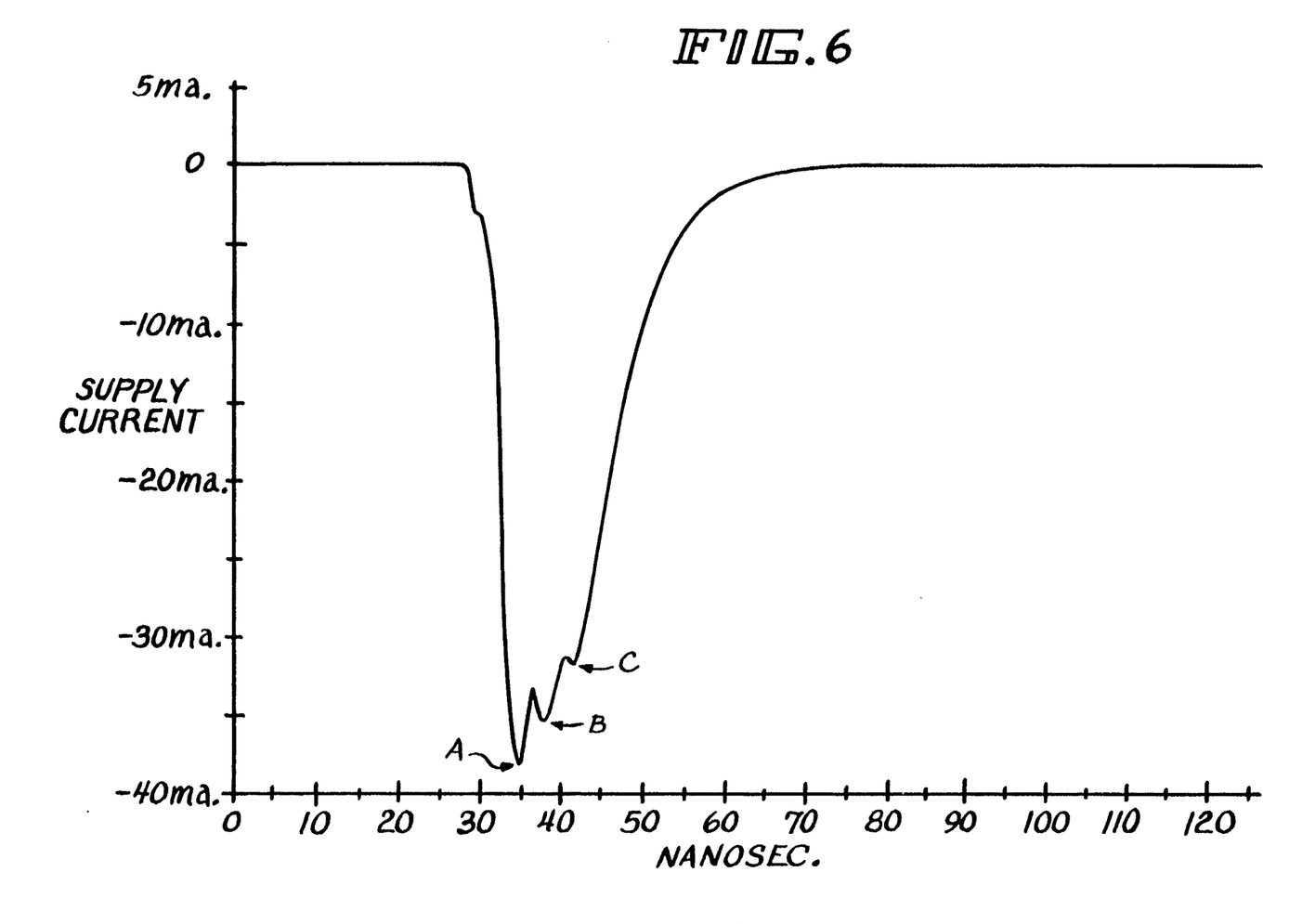

FIG. 6 shows how the current spike has been broadened. Generally, the curve in FIG. 6 represents the current draw corresponding to a group of memory cells. That is, it is the $V_{CC}$ current spike for all sense amplifiers (within a certain group). The drawing shows three points A, B, and C. At point A, which is the maximum current draw, shown as less than 40 milliamps, the signals LNB and LPB go to their intermediate level. Shortly thereafter, at point B, the signal ISO (ISOR) rises above $V_{CC}$, which is shown in FIG. 5. A few nanoseconds later, point C occurs at which the signals LNB and LPB go to their full values of $V_{CC}$ and $V_{SS}$. Thus, it will be noted that the current spike is spread into three portions, as illustrated in FIG. 6.

While the circuit of FIG. 4 is configured especially for use with the improved sense amplifier configuration using local (distributed) driver transistors, it can also be used with sense amplifiers having lumped driver transistors according to the configuration shown in FIG. 1 of the application referenced herein (UM-109).

I claim:

1. A method of generating a control signal for controlling the operation of sense amplifier driver transistors in an integrated circuit memory comprising the steps of:
   causing a change in voltage of a sense amplifier power supply control signal to an intermediate value between a precharge value and a final value;
   maintaining said intermediate value voltage for a duration; then
   bringing the sense amplifier power supply control signal to its full value.

2. The method of claim 1 wherein said bringing step includes changing the voltage at a controlled rate.

3. The method of claim 1 wherein said causing and bringing steps include coupling a constant current source to the control signal.

4. The method of claim 1 wherein said causing and bringing steps include coupling a constant current source to the control signal;
   wherein said maintaining step includes commencing a time epoch in response to the control signal reaching said intermediate value, the commencing step comprising starting a timer circuit and applying an output of said timer circuit to a current modeling circuit; and
   starting the constant current source based on a signal from the said modeling circuit.

5. The method of claim 1 wherein said causing step includes changing the voltage at a controlled rate.

6. The method of claim 5 wherein said bringing step includes changing the voltage at a controlled rate.

7. The method of claim 1 wherein said maintaining step includes commencing a time epoch in response to the control signal reaching said intermediate value.

8. The method of claim 7 wherein said commencing step comprises sensing the intermediate value.

9. The method of claim 8 including starting a timer circuit, applying an output of said timer circuit to a current modeling circuit, and responding to the end of the time epoch by operating a constant current source.

10. The method of claim 1 further comprising generating a second sense amplifier power supply control signal having a respective intermediate value and having transition points at substantially the same times as the first-named sense amplifier power supply control signal.

11. The method of claim 10 wherein said second sense amplifier power supply control signal changes at a controlled rate to said intermediate value, maintains said intermediate value for a time epoch, and changes at the controlled rate to its final value.

12. The method of claim 10 wherein one of said sense amplifier power supply control signals begins at one voltage level, transitions to its intermediate value, and then transitions to a second voltage level; and the other sense amplifier power supply control signal begins at the second voltage level, transitions to its intermediate value, and then transitions to the first level.

13. A sense amplifier clock driver circuit for an integrated circuit memory, the driver circuit providing at least one control signal for controlling the operation of sense amplifier driver transistors and comprising:
   a timer circuit;
   a sense amplifier current monitor circuit responsively coupled to the timer circuit;
   a constant current source responsively coupled to the monitor circuit and providing an input to the monitor circuit;
   an output node coupled to the constant current source.

14. The driver circuit of claim 13 wherein the driver circuit provides a second control signal, the driver circuit further comprising:
   a second sense amplifier current monitor circuit responsively coupled to said timer circuit;
   a second constant current source responsively coupled to the second monitor circuit;
   a second output node coupled to said second constant current source.

15. The driver circuit of claim 14 wherein each of said monitor circuits is coupled to receive as an input the corresponding control signal.

16. A method of controlling the operation of sense amplifier driver transistors in an integrated circuit memory wherein the sense amplifiers receive power from power supply circuitry in accordance with a power supply control signal, the method comprising the steps of:
   controlling a sense amplifier power supply control signal to provide an initial sensing stage;
   controlling the sense amplifier power supply control signal to have an intermediate voltage to regulate current spikes; and thereafter
   driving the sense amplifier power supply control signal to a full active state.

* * * * *